(12) United States Patent
Kishiwada et al.

(10) Patent No.: US 11,343,942 B2
(45) Date of Patent: May 24, 2022

(54) POWER CONVERSION DEVICE INCLUDING COOLING COMPONENTS

(71) Applicant: Mitsubishi Electric Corporation, Tokyo (JP)

(72) Inventors: Yu Kishiwada, Tokyo (JP); Yasuhiko Kitamura, Tokyo (JP); Hiroaki Takahashi, Tokyo (JP); Shogo Matsuoka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/044,044

(22) PCT Filed: May 14, 2018

(86) PCT No.: PCT/JP2018/018488
§ 371 (c)(1),
(2) Date: Sep. 30, 2020

(87) PCT Pub. No.: WO2019/220485
PCT Pub. Date: Nov. 21, 2019

(65) Prior Publication Data
US 2021/0100129 A1    Apr. 1, 2021

(51) Int. Cl.
*H05K 7/20* (2006.01)
*H05K 1/02* (2006.01)
(Continued)

(52) U.S. Cl.
CPC ....... *H05K 7/2039* (2013.01); *H01L 23/3675* (2013.01); *H02M 7/003* (2013.01);
(Continued)

(58) Field of Classification Search
CPC .............. H05K 7/1427; H05K 7/2039; H05K 7/20436; H05K 7/20454; H05K 7/30854;
(Continued)

(56) References Cited

U.S. PATENT DOCUMENTS 5,373,418 A * 12/1994 Hayasi ................. H01L 23/3675
361/707
6,326,761 B1 * 12/2001 Tareilus ................. H02M 7/003
318/722
(Continued)

FOREIGN PATENT DOCUMENTS

CN       105981168 B  * 10/2018   ............. H01L 25/07
DE       19959171 A1  * 12/2000   ............. H02M 7/003
(Continued)

OTHER PUBLICATIONS

English Translation of JP2010103372 (Year: 2010).*
(Continued)

*Primary Examiner* — Zachary Pape
*Assistant Examiner* — Amir A Jalali
(74) *Attorney, Agent, or Firm* — Sughrue Mion, PLLC; Richard C. Turner

(57) ABSTRACT

The present application has an object of restricting a temperature rise caused by heat generated by an electronic part or a connection member mounted on a substrate, and includes a first heat conducting member that thermally couples the bus bar extended to a housing side and the housing, a second heat conducting member that thermally couples a capacitor and the housing, and a third heat conducting member that thermally couples a semiconductor element and the housing, wherein each of the bus bar, the substrate, the capacitor, and the semiconductor element is cooled.

20 Claims, 3 Drawing Sheets

(51) Int. Cl.
*H01L 23/367* (2006.01)
*H02M 7/00* (2006.01)
*H02M 7/537* (2006.01)

(52) U.S. Cl.
CPC .......... *H02M 7/537* (2013.01); *H05K 1/0204* (2013.01); *H05K 7/20927* (2013.01); *H05K 2201/10015* (2013.01); *H05K 2201/10431* (2013.01)

(58) Field of Classification Search
CPC .......... H05K 7/20872; H05K 7/20927; H05K 1/0272; H05K 1/02–0212; H05K 1/18–188; H05K 2201/062–064; H05K 2201/10015; H05K 2201/10431; H05K 2201/10409; H05K 2201/1056; H05K 2201/10166; H01L 23/36–3675; H01L 23/40; H01L 23/4006; H01L 23/42; H01L 23/46; H01L 23/473; H01L 2023/4031; H01L 2023/4062; H01L 2924/181; H02M 7/00; H02M 7/003; H02M 7/537
See application file for complete search history.

(56) References Cited

U.S. PATENT DOCUMENTS

| | | | |
|---|---|---|---|
| 2010/0103622 | A1 | 4/2010 | Kato et al. |
| 2012/0002374 | A1 | 1/2012 | Kato et al. |
| 2016/0021789 | A1 | 1/2016 | Negishi et al. |
| 2017/0295662 | A1* | 10/2017 | Sakai ............... F04D 13/06 |
| 2018/0026545 | A1* | 1/2018 | Numakura ............ H05K 7/02 361/689 |

FOREIGN PATENT DOCUMENTS

| | | | | | |
|---|---|---|---|---|---|
| DE | 102008054923 | A1 | * | 7/2010 | ........... H01L 25/072 |
| DE | 112012000617 | T5 | * | 11/2013 | ............. H02K 11/33 |
| DE | 102016122018 | A1 | * | 5/2017 | ......... H01L 23/4012 |
| DE | 102016204460 | A1 | * | 9/2017 | ........... H05K 7/1432 |
| DE | 112016000877 | T5 | * | 11/2017 | .............. H02M 7/48 |
| JP | 3-278596 | A | | 12/1991 | |
| JP | 2002095268 | A | * | 3/2002 | ............ H02M 7/003 |
| JP | 2002314038 | A | * | 10/2002 | |
| JP | 2010-103370 | A | | 5/2010 | |
| JP | 2010-103371 | A | | 5/2010 | |
| JP | 2010-103372 | A | | 5/2010 | |
| JP | 2010103372 | A | * | 5/2010 | |
| JP | 2013-165202 | A | | 8/2013 | |
| JP | 2014-187063 | A | | 10/2014 | |
| JP | 2015-126590 | A | | 7/2015 | |
| JP | 2016-82603 | A | | 5/2016 | |
| JP | 2016-182031 | A | | 10/2016 | |
| JP | 2017-55650 | A | | 3/2017 | |
| JP | 2017-85800 | A | | 5/2017 | |
| JP | 2017085800 | A | * | 5/2017 | |

OTHER PUBLICATIONS

English Translation of DE102008054923 (Year: 2010).*
English Translation of JP2017085800 (Year: 2017).*
International Search Report for PCT/JP2018/018488 dated, Jun. 12, 2018 (PCT/ISA/210).
Notice of Reasons for Refusal dated Apr. 6, 2021 from the Japanese Patent Office in JP Application No. 2020-519217.

* cited by examiner

POWER CONVERSION DEVICE INCLUDING COOLING COMPONENTS

CROSS REFERENCE TO RELATED APPLICATIONS

This application is a National Stage of International Application No. PCT/JP2018/018488 filed May 14, 2018.

TECHNICAL FIELD

The present application relates to a power conversion device wherein heat is effectively dissipated from an electronic part or a heat generating member.

BACKGROUND ART

There is existing technology such that, when cooling an electrolytic capacitor, a capacitor housing portion is provided so as to follow the form of a metal case on an outer periphery of the electrolytic capacitor, and a coolant path is disposed immediately below the capacitor housing portion, whereby heat generated in the electrolytic capacitor is transferred to the capacitor housing portion, further transferred from the capacitor housing portion to the coolant, and cooled (for example, refer to Patent Literature 1). Also, there is technology such that a thermal grease is applied between an electronic part mounted on a circuit substrate and a case, and heat generated by the electronic part is transferred to the thermal grease, and further transferred to the case, thereby being dissipated into the air (for example, refer to Patent Literature 2).

CITATION LIST

Patent Literature

Patent Literature 1: JP-A-2016-182031
Patent Literature 2: JP-A-2014-187063

SUMMARY OF INVENTION

Technical Problem

In the heretofore described Patent Literature 1, a clearance between the metal case on the outer periphery of the electrolytic capacitor and the capacitor housing portion greatly affects cooling performance. For example, a gap occurs between the metal case and the capacitor housing portion of the electrolytic capacitor due to assembly dimensional tolerance, and thermal resistance increases, because of which this cannot be adopted as an efficient cooling method.

Also, in Patent Literature 2, the increase in thermal resistance in Patent Literature 1 can be restricted by applying thermal grease between the electronic part and the case, but as a heat dissipating path from the case is only a space, this cannot be adopted as an efficient cooling method, even when using a case of aluminum or the like, which has good thermal conductivity.

Furthermore, the electronic part is electrically and mechanically connected to the circuit substrate, and the electronic part is mechanically connected to the case after the thermal grease hardens, because of which stress is exerted on each connection place when subjected to vibration from an exterior in this kind of connected state, and reliability is lost due to electrical wiring disconnection, dislocation of a mechanically fixed portion, or the like.

The present application discloses technology for resolving the heretofore described kinds of problem, and has an object of providing a power conversion device such that an electronic part and a heat generating member can be caused to dissipate heat efficiently, and a cooling performance can be improved.

Solution to Problem

A power conversion device disclosed in the present application is characterized by including a housing that supports each constituent member, a substrate, fixed onto a protruding portion of the housing, on which an electronic part is mounted, a capacitor disposed between the housing and the substrate, a multiple of semiconductor elements, attached onto the housing, that form an electrical circuit together with the capacitor, a bus bar that has a heat dissipating portion extended to the housing side and supplies power by connecting the capacitor and the semiconductor element to the substrate, and a coolant path, provided on a lower face of the housing, along which a coolant that cools the housing is caused to flow, and including a first heat conducting member that and thermally couples the bus bar and the housing, a second heat conducting member that thermally couples the capacitor and the housing, and a third heat conducting member that thermally couples the semiconductor element and the housing, wherein each of the bus bar, the substrate, the capacitor, and the semiconductor element is cooled.

Advantageous Effects of Invention

According to the power conversion device of the present application, an electronic part and a heat generating member can be caused to dissipate heat efficiently, and a cooling performance can be improved. Because of this, an increase in lifespan of the electronic part, together with a reduction in size and an increase in output, can be expected.

DESCRIPTION OF EMBODIMENTS

Hereafter, embodiments will be described based on the drawings.

First Embodiment

Figure 1A:
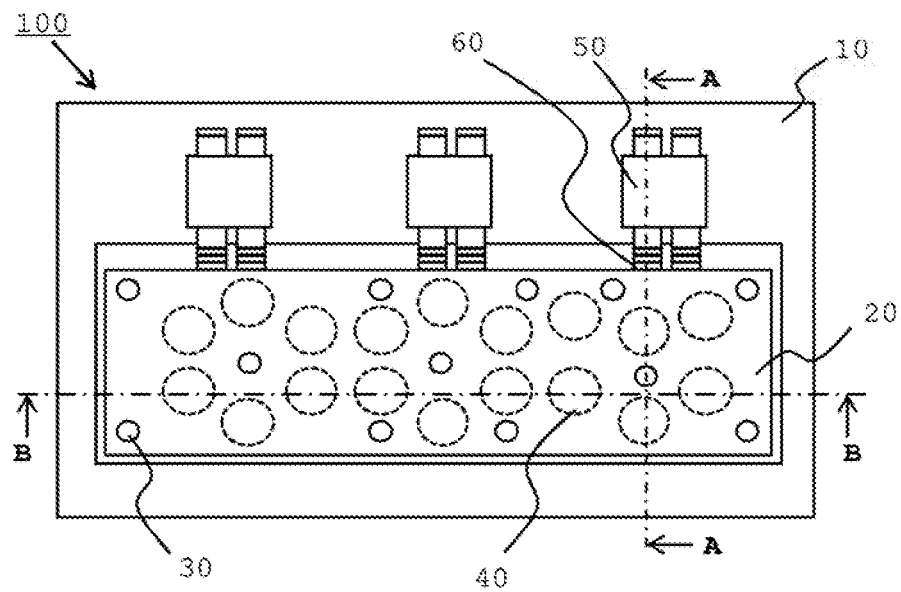
FIG. 1A is a front view showing a power conversion device relating to a first embodiment.
Figure 1B:
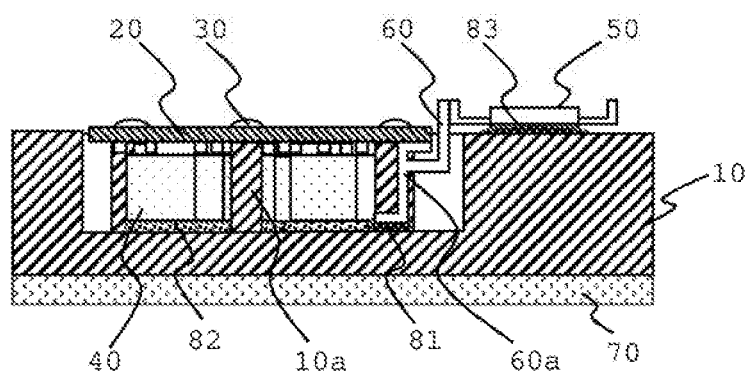
FIG. 1B is a sectional view along an A-A line of FIG. 1A.
Figure 1C:
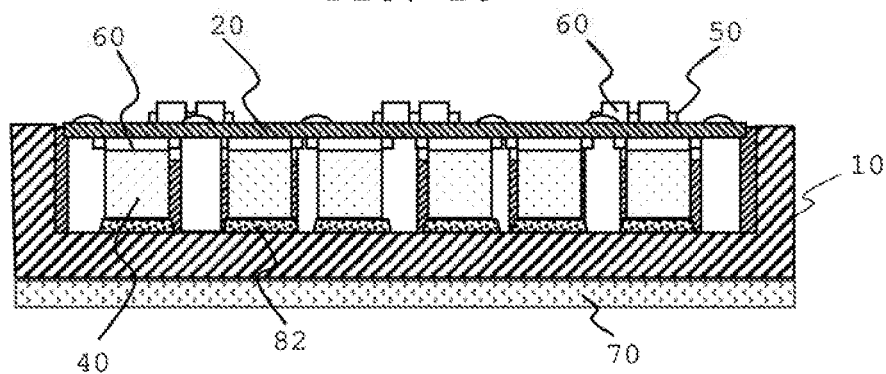
FIG. 1C is a sectional view along a B-B line of FIG. 1A.

FIG. 1A is a front view showing a power conversion device relating to a first embodiment, FIG. 1B is a sectional view along an A-A line of FIG. 1A, and FIG. 1C is a sectional view along a B-B line of FIG. 1A.

In the drawings, a power conversion device 100 is configured to include a housing 10 that supports each constituent member, a protruding portion 10a extended upward from the housing 10, a substrate 20, fixed onto the protruding portion 10a, on which an electronic part is mounted, a fixing member 30 that fixes the substrate 20 onto the protruding portion 10a of the housing 10, a multiple of capacitors 40 disposed between the housing 10 and the substrate 20, and a multiple of semiconductor elements 50, attached onto the housing 10, that form an electrical circuit of the power conversion device 100 together with the capacitors 40. Also, a bus bar 60 for supplying power from an unshown direct current power supply is connected to the capacitors 40 and the semiconductor elements 50. Furthermore, a coolant path 70 along which a coolant is caused to flow is provided on a lower face of the housing 10.

Herein, aluminum, which has good thermal conductivity, is basically desirable as a material of the housing 10, but another material having the same function (for example, copper, stainless steel, or an alloy) may be used when necessary.

Also, a phenolic paper (XPC), a paper epoxy (FR-3), a glass composite (CEM-3), or a glass-reinforced epoxy (FR-4) can be used for the substrate 20, and which of these is to be used can be decided in accordance with characteristics such as continuous operating temperature, solder heat resistance, insulation resistance, relative permittivity, and dielectric loss tangent. Also, the substrate 20 may be a substrate having a wiring pattern on both faces only, or a substrate having a wiring pattern on several layers. In particular, a thickness of a wiring pattern of the substrate 20 is varied at 35 μm, 70 μm, or 105 μm. Furthermore, a through hole (also called a via) having electrical connection as a main object is disposed in the substrate 20, but the through hole can also be used as a thermal connection, and by a necessary quantity of through holes of a necessary size being disposed in necessary positions, thermal resistance is reduced and heat is diffused, whereby a heat dissipating advantage can be increased.

Also, screws of various metals and sizes can be used as the fixing member 30 that fixes the substrate 20 to the housing 10, and another fixing method can be used provided that the substrate 20 and the housing 10 can be fixed.

Furthermore, an aluminum electrolytic capacitor, a capacitor in which a conductive polymer is used, a hybrid aluminum electrolytic capacitor configured of both an electrolytic solution and a conductive polymer, a film capacitor, or the like, is generally used as the capacitor 40, but another capacitive electronic part may also be used.

Also, the semiconductor element 50 is a switching element used in a power circuit of an inverter or a converter, and is typically an IGBT or a MOSFET. Also, the semiconductor element 50 is connected to the bus bar 60 by soldering, welding, screw fastening, or the like.

The number of semiconductor elements 50 used varies in accordance with a circuit configuration of the inverter or the converter.

Next, a cooling structure using the bus bar 60, which configures a main portion of the power conversion device 100 of the present application, will be described.

Figure 2A:
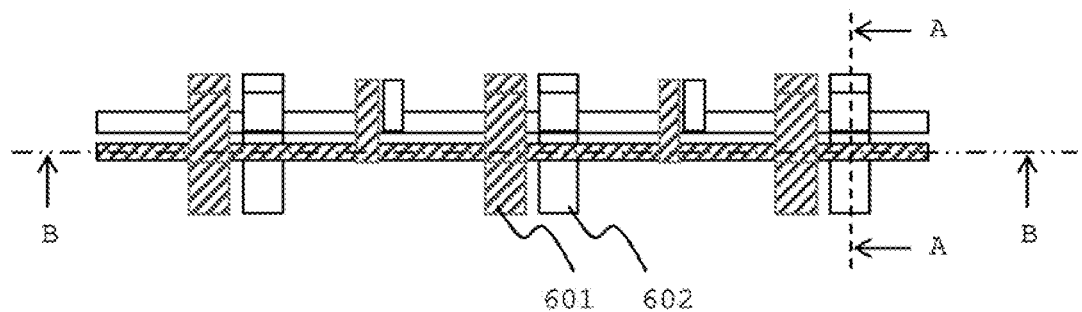
FIG. 2A is a front view showing a form of a bus bar in the first embodiment.
Figure 2B:
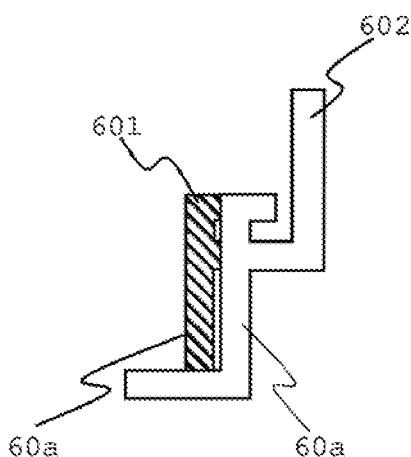
FIG. 2B is a sectional view along an A-A line of FIG. 2A.
Figure 2C:
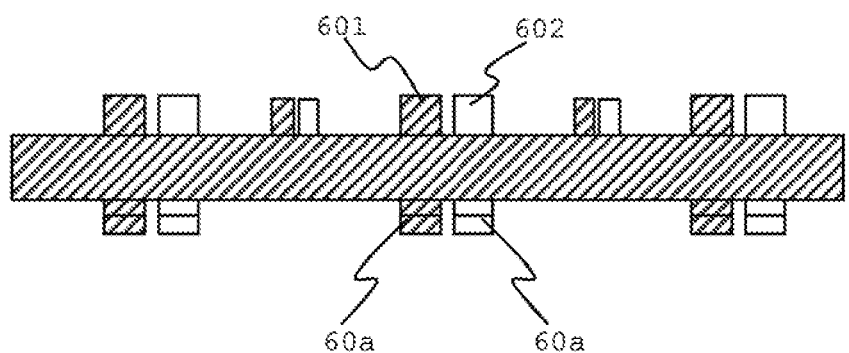
FIG. 2C is a sectional view along a B-B line of FIG. 2A.

As the bus bar 60 is connected to the direct current power supply, the bus bar 60 has a bipolar configuration of a positive side 601 and a negative side 602, as shown in FIG. 2, and in order that a short circuit does not occur between the two poles, the bus bar 60 is insulated, or the two poles are isolated from each other using an insulating member. Using a copper material, this kind of bus bar 60 can be processed into a three-dimensional body using a combination of processing methods such as pressing, cutting, and laser processing, and can be formed in an arbitrary form. A conductive metal such as aluminum can be used as a material of the bus bar 60.

A heat dissipating portion 60a wherein one portion of the bus bar 60 is extended in the direction of the housing 10 is formed in the bus bar 60, and a first heat conducting member 81 is applied between a lower end of the heat dissipating portion 60a and the housing 10. Herein, an amount of heat transferred can be increased by a leading end of the heat dissipating portion 60a of the bus bar 60 being extended in the plane of the housing 10. As the bus bar 60 connected to the direct current power supply has a potential, the bus bar 60 is set so as to secure insulation by a certain spatial distance being provided between the bus bar 60 and the housing 10.

Herein, materials in various forms such as a sheet form or a grease form, generally called TIMs (thermal interface materials), are known as the first heat conducting member 81. Which sheet form material is to be used should be decided in accordance with applications of size, thickness, softness, and the like, and which grease form material is to be used should be decided with consideration to whether or not the material is a hardening type, viscosity after hardening, an effect of oil bleed, and the like. As materials, there are silicon-based materials, acrylic materials, styrene-based materials, and the like.

Also, a second heat conducting member 82 is applied between the capacitor 40 and the housing 10.

In the same way as with the first heat conducting member 81, whether the second heat conducting member 82 is to be of a grease form or a sheet form can be decided in accordance with form, characteristics, and application, but when the second heat conducting member 82 is to be disposed between the multiple of capacitors 40 and the housing 10, as shown in FIG. 1, a grease form material or a soft sheet form material with elasticity, for example, is preferred.

The reason is that an assembly dimensional tolerance occurring when fixing the substrate 20 to the housing 10, or in other words, differing distances between surfaces of the multiple of capacitors 40 and the plane of the housing 10, can be absorbed. Because of this, thermal resistance between the capacitor 40 and the second heat conducting member 82 and thermal resistance between the second heat conducting member 82 and the housing 10 can be equalized as far as possible, that is, exhaust heats of the multiple of capacitors 40 can be of the same extent.

In order to cause the sheet form second heat conducting member 82 to adhere to the capacitor 40 and the housing 10 when the assembly dimensional tolerance is extremely large, the sheet thickness needs to be increased, as a result of which a large stress is exerted on one portion of the capacitors 40, and there is concern that the connection between the capacitor 40 and the substrate 20 will be broken, that a copper foil pattern of the substrate 20 will be detached or disconnected, or the like.

When this kind of concern is high, the concern can be eliminated by choosing the grease form second heat conducting member 82. Also, when selecting a grease that does not completely harden, a minute displacement can be tolerated within a range such that a cooling performance is not affected, and an advantage can be expected in that vibration from the exterior can be absorbed.

Furthermore, the semiconductor element 50 is such that a third heat conducting member 83 is disposed between a heat dissipating face of the semiconductor element 50 and the housing 10.

In the same way as with the first heat conducting member 81 and the second heat conducting member 82, whether the third heat conducting member 83 is to be of a grease form or a sheet form can be decided in accordance with form, characteristics, and application.

Heat generated by the semiconductor element 50 itself or heat transferred from the bus bar 60 can be transferred to the housing 10 via the third heat conducting member 83.

The cooling performance can be equalized by providing the third heat conducting member 83 on each of the positive side 601 and the negative side 602 of the bus bar 60. Also, when there is an imbalance in the cooling performance of the bus bar 60, the imbalance can be eliminated by increasing the number of heat dissipating portions 60a on the pole side with the lower cooling performance.

Heat generated by each of the semiconductor element 50 and the capacitor 40 is transmitted by the first heat conducting member 81, the second heat conducting member 82, and the third heat conducting member 83 to the housing 10 and dissipated, and furthermore, the whole of the housing 10 can be cooled by causing a coolant to flow along the coolant path 70 provided adjacent to the housing 10. Although a long life coolant (LLC) including ethylene glycol is used as the coolant, another liquid having a cooling function can also be used.

Next, a second embodiment will be described, using FIG. 3.

Figure 3:
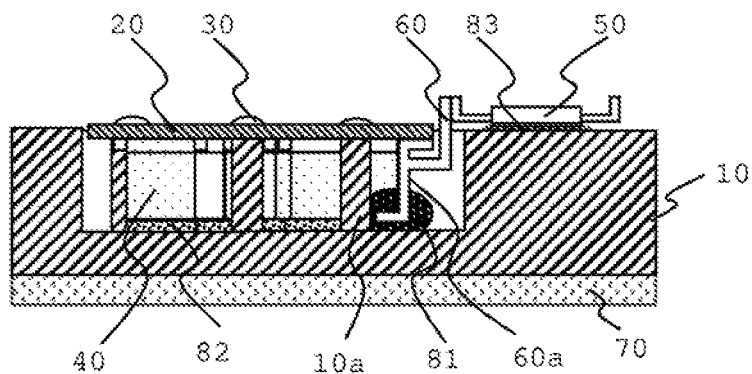
FIG. 3 is a sectional view showing a power conversion device relating to a second embodiment.

FIG. 3 is a sectional view showing a power conversion device relating to the second embodiment.

In the drawing, the first heat conducting member 81 is disposed between the heat dissipating portion 60a of the bus bar 60 and a side face of the protruding portion 10a of the housing 10. As other configurations are the same as in the first embodiment, the same reference signs are allotted to identical or corresponding portions, and a description will be omitted.

By the first heat conducting member 81 being provided as far as the side face of the protruding portion 10a of the housing 10 in this way, thermal resistance between the bus bar 60 and the housing 10 can be lowered, and the cooling performance can be improved.

Next, a third embodiment will be described, using FIG. 4.

Figure 4:
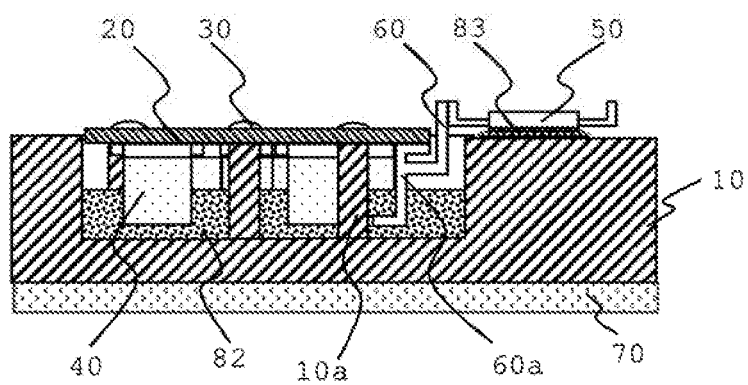
FIG. 4 is a sectional view showing a power conversion device relating to a third embodiment.

FIG. 4 is a sectional view showing a power conversion device relating to the third embodiment.

In the drawing, up to one-half of the distance between the substrate 20 and the housing 10 is filled with the second heat conducting member 82. As other configurations are the same as in the first embodiment, the same reference signs are allotted to identical or corresponding portions, and a description will be omitted.

By the second heat conducting member 82 being provided on the side face of the heat dissipating portion 60a of the bus bar 60, the side face of the capacitor 40, and the side face of the protruding portion 10a of the housing 10 in this way, thermal resistance between the bus bar 60, the capacitor 40, and the housing 10 can be further improved.

The first heat conducting member 81 may be provided instead of the second heat conducting member 82.

Next, a fourth embodiment will be described.

Figure 5:
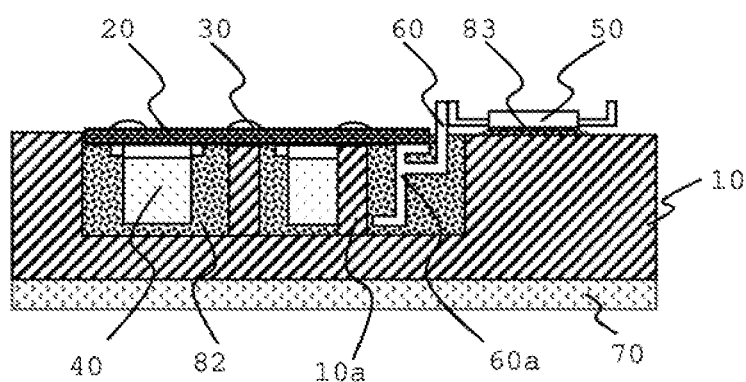
FIG. 5 is a sectional view showing a power conversion device relating to a fourth embodiment.

FIG. 5 is a sectional view showing a power conversion device relating to the fourth embodiment.

In the drawing, practically the whole of a space between the substrate 20 and the housing 10 is filled with the second heat conducting member 82. As other configurations are the same as in the third embodiment, the same reference signs are allotted to identical or corresponding portions, and a description will be omitted.

By the second heat conducting member 82 being provided between the side face of the heat dissipating portion 60a of the bus bar 60, the side face of the capacitor 40, and the side face of the protruding portion 10a of the housing 10 in this way, thermal resistance between the bus bar 60, the capacitor 40, and the housing 10 can be lowered, and the cooling performance can be further improved. In particular, there is also an advantage in that heat can also be dissipated from a broad face of the bus bar 60 parallel to the substrate 20.

The first heat conducting member 81 may be provided instead of the second heat conducting member 82.

According to the embodiments of the present application, as heretofore described, the cooling performance of a power conversion device improves, because of which a rise in temperature (a temperature variation range) of, for example, the capacitor 40 can be restricted, whereby an increase in lifespan can be achieved. Also, temperature stress exerted on the substrate 20 or the semiconductor element 50 is reduced, whereby the quality of a soldered portion of, for example, the substrate 20 can be improved, part deterioration of the semiconductor element can be restricted, and long-term reliability can be secured. Furthermore, the housing 10, which functions as a heatsink, can be reduced in size and weight, which can also contribute to a cost reduction.

Although the present disclosure is described above in terms of various exemplifying embodiments, it should be understood that the various features, aspects, and functions described in one or more of the individual embodiments are not limited in their applicability to the particular embodiment with which they are described, but instead can be applied, alone or in various combinations, to one or more of the embodiments.

It is therefore understood that numerous modifications that have not been exemplified can be devised without departing from the scope of the present application. For example, at least one constituent component may be modified, added, or omitted.

INDUSTRIAL APPLICABILITY

The present application is appropriate as a vehicle-use power conversion device such as a direct current power supply generated in a product interior, or a direct current power supply of a 12V system, a 24V system, or a 48V system battery supplied from a product exterior.

REFERENCE SIGNS LIST

10: housing, 20: substrate, 30: fixing member, 40: capacitor, 50: semiconductor element, 60: bus bar, 60a: heat dissipating portion, 70: coolant path, 81: first heat conducting member, 82: second heat conducting member, 83: third heat conducting member

The invention claimed is:

1. A power conversion device, comprising:
a housing that supports each constituent member;
a substrate, fixed to the housing, on which an electronic part is mounted, and extending in a horizontal direction;
a capacitor disposed between the housing and the substrate;

a multiple of semiconductor elements, attached onto the housing, that form an electrical circuit together with the capacitor;

a bus bar that has a heat dissipating portion and supplies power by connecting the capacitor and the semiconductor element to the substrate, wherein the heat dissipating portion includes a first end portion extending in the horizontal direction, and a second end portion extending in a vertical direction and passing through a gap between the substrate and the housing in the vertical direction;

a coolant path, provided on a lower face of the housing, along which a coolant that cools the housing is caused to flow;

a first heat conducting member that thermally couples the bus bar and the housing;

a second heat conducting member that thermally couples the capacitor and the housing; and a third heat conducting member that thermally couples the semiconductor element and the housing, wherein each of the bus bar, the substrate, the capacitor, and the semiconductor element is cooled.

2. The power conversion device according to claim 1, wherein the first heat conducting member and the second heat conducting member are of the same material.

3. The power conversion device according to claim 2, wherein the bus bar is connected in at least one place to the semiconductor element.

4. The power conversion device according to claim 3, wherein a multiple of the capacitor are mounted on the substrate.

5. The power conversion device according to claim 3, wherein the housing has a protruding portion extended to a substrate side in the vertical direction, and the substrate is fixed to the protruding portion.

6. The power conversion device according to claim 2, wherein the bus bar is connected in at least one place to the substrate.

7. The power conversion device according to claim 2, wherein a multiple of the capacitor are mounted on the substrate.

8. The power conversion device according to claim 2, wherein the housing has a protruding portion extended to a substrate side in the vertical direction, and the substrate is fixed to the protruding portion.

9. The power conversion device according to claim 2, wherein the first heat conducting member or the second heat conducting member is provided between multiple faces of each of the heat dissipating portion of the bus bar, the capacitor, the housing, and a protruding portion of the housing.

10. The power conversion device according to claim 1, wherein the bus bar is connected in at least one place to the semiconductor element.

11. The power conversion device according to claim 10, wherein the bus bar is connected in at least one place to the substrate.

12. The power conversion device according to claim 11, wherein the bus bar has a bipolar configuration of a positive pole and a negative pole, and the heat dissipating portion is provided in each pole, and wherein the positive pole and the negative pole are spaced apart from each other in the horizontal direction, while extending in the vertical direction to be parallel with each other.

13. The power conversion device according to claim 11, wherein the bus bar has a bipolar configuration of a positive pole and a negative pole, and a quantity of the heat dissipating portion differs between poles, and wherein the positive pole and the negative pole are spaced apart from each other in the horizontal direction, while extending in the vertical direction to be parallel with each other.

14. The power conversion device according to claim 10, wherein a multiple of the capacitor are mounted on the substrate.

15. The power conversion device according to claim 10, wherein the housing has a protruding portion extended to a substrate side in the vertical direction, and the substrate is fixed to the protruding portion.

16. The power conversion device according to claim 1, wherein the bus bar is connected in at least one place to the substrate.

17. The power conversion device according to claim 16, wherein the housing has a protruding portion extended to a substrate side in the vertical direction, and the substrate is fixed to the protruding portion.

18. The power conversion device according to claim 1, wherein a multiple of the capacitor are mounted on the substrate.

19. The power conversion device according to claim 1, wherein the housing has a protruding portion extended to a substrate side in the vertical direction, and the substrate is fixed to the protruding portion.

20. The power conversion device according to claim 1, wherein the heat dissipating portion of the bus bar is provided in multiple places.

* * * * *